United States Patent
Wei et al.

(10) Patent No.: US 11,393,772 B2
(45) Date of Patent: Jul. 19, 2022

(54) BONDING METHOD FOR SEMICONDUCTOR SUBSTRATE, AND BONDED SEMICONDUCTOR SUBSTRATE

(71) Applicant: Shanghai Simgui Technology Co., Ltd., Shanghai (CN)

(72) Inventors: Xing Wei, Shanghai (CN); Xin Su, Shanghai (CN); Hongtao Xu, Shanghai (CN); Meng Chen, Shanghai (CN); Nan Gao, Shanghai (CN)

(73) Assignee: Shanghai Simgui Technology Co., Ltd., Shanghai (CN)

(*) Notice: Subject to any disclaimer, the term of this patent is extended or adjusted under 35 U.S.C. 154(b) by 278 days.

(21) Appl. No.: 16/584,215

(22) Filed: Sep. 26, 2019

(65) Prior Publication Data

US 2020/0098703 A1    Mar. 26, 2020

(51) Int. Cl.
*H01L 23/00* (2006.01)
*H01L 21/762* (2006.01)
*H01L 27/12* (2006.01)

(52) U.S. Cl.
CPC ...... *H01L 23/562* (2013.01); *H01L 21/76251* (2013.01); *H01L 27/1203* (2013.01)

(58) Field of Classification Search
CPC ........... H01L 21/76251; H01L 21/3225; H01L 21/3226; H01L 27/1203; H01L 23/562
See application file for complete search history.

(56) References Cited

U.S. PATENT DOCUMENTS 7,902,042 B2 * 3/2011 Aga .................. H01L 21/76254
                                            438/458

FOREIGN PATENT DOCUMENTS

| CN | 1061705 C | 2/2001 | |
|---|---|---|---|
| CN | 101070621 A | 11/2007 | |
| CN | 101494177 A | 7/2009 | |
| CN | 102130037 A | 7/2011 | |
| CN | 104766788 A | 7/2015 | |
| CN | 105845548 A | 8/2016 | |
| JP | 2000031439 A | * 1/2000 | ......... H01L 21/3226 |
| JP | 2002270800 A | 9/2002 | |
| WO | 9838675 A1 | 9/1998 | |

* cited by examiner

*Primary Examiner* — Sue A Purvis
*Assistant Examiner* — Scott Stowe
(74) *Attorney, Agent, or Firm* — Arch & Lake LLP

(57) ABSTRACT

The present disclosure provides a bonding method for a semiconductor substrate, which may improve flatness of a bonded substrate. The present disclosure further provides a bonded semiconductor substrate. The semiconductor substrate is thermally treated prior to bonding, and oxygen precipitates in the semiconductor substrate are partially or totally converted to interstitial oxygen atoms in the thermal treatment.

9 Claims, 3 Drawing Sheets

BONDING METHOD FOR SEMICONDUCTOR SUBSTRATE, AND BONDED SEMICONDUCTOR SUBSTRATE

TECHNICAL FIELD

The present application is based on and claims the priority to Chinese patent application No. CN201811124962.2, filed on Sep. 26, 2018, which is incorporated by reference herein in its entirety.

TECHNICAL FIELD

The present disclosure relates to the technical field of semiconductor materials, and in particular, relates to a bonding method for a semiconductor substrate, and a bonded semiconductor substrate.

BACKGROUND

In manufacturing of an SOI substrate, bonding and high-temperature reinforcement are mandatory. Tests have revealed that a substrate subjected to bonding and reinforcement may have an obviously increased warpage through multiple oxidations or epitaxial growth processes or the like thermal treatment. As a result, manufacturing yield of integrated circuits is lowered. In addition, similar problems are not found on the other substrates which require the bonding process. Therefore, how to reduce the warpage of the bonded semiconductor substrate is a problem to be urgently solved in the related art.

SUMMARY

A technical problem to be solved by the present disclosure is to provide a bonding method for a semiconductor substrate, and a bonded semiconductor substrate, which may improve flatness of a bonded substrate.

In view of above, one aspect of the present disclosure provides a bonding method for a semiconductor substrate. The method includes: performing a thermal treatment for a semiconductor substrate for bonding at a first temperature prior to bonding, wherein the first temperature is lower than a second temperature at which a bonding interface is thermally reinforced upon bonding, and oxygen precipitates in the semiconductor substrate are partially or totally converted to interstitial oxygen atoms in the thermal treatment.

Another aspect of the present disclosure further provides a bonded semiconductor substrate, wherein a thermal treatment is performed for the semiconductor prior to bonding at a first temperature, wherein the first temperature is not higher than a second temperature at which at which a bonding interface is thermally reinforced upon the bonding, and oxygen precipitates in the semiconductor substrate are partially or totally transformed to interstitial oxygen atoms in the thermal treatment.

DETAILED DESCRIPTION

A bonding method for a semiconductor substrate, and a bonded semiconductor substrate according to the present disclosure are described hereinafter with reference to the specific embodiments and accompanying drawings.

Figure 1:
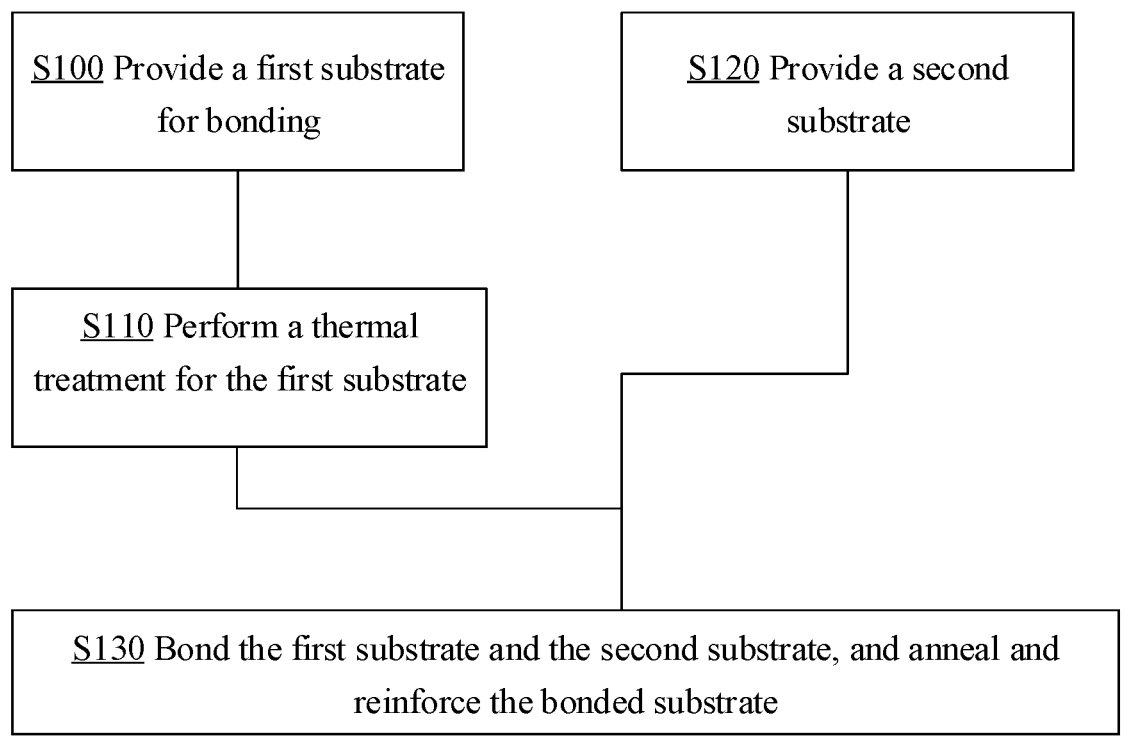
FIG. 1 is a schematic diagram of steps of a bonding method for a semiconductor substrate according to one specific embodiment of the present disclosure.

FIG. 1 is a schematic diagram of steps of a bonding method for a semiconductor substrate according to one specific embodiment of the present disclosure. The method includes: step S100: providing a first substrate for bonding, wherein the first substrate is a semiconductor substrate; step S110, performing a thermal treatment for the first substrate at a first temperature; step S120: providing a second substrate; and step S130: bonding the first substrate and the second substrate, and annealing and reinforcing the bonded substrate at a second temperature.

FIG. 2A to FIG. 2D are schematic process diagrams of the bonding method for a semiconductor substrate according to a specific embodiment of the present disclosure.

Figure 2A:
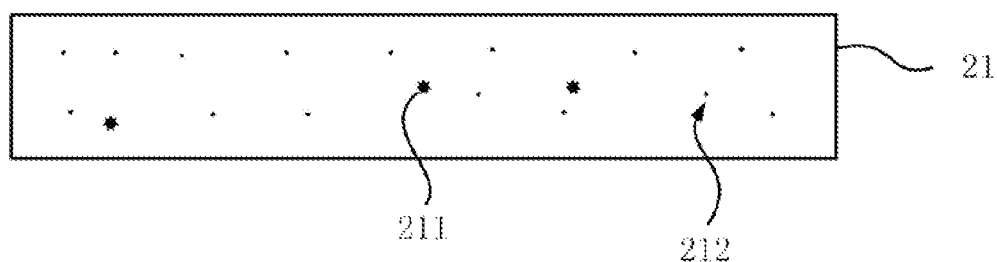
FIG. 2A illustrates a schematic process diagram of a first step in the bonding method for a semiconductor substrate according to one aspect of the present disclosure.

As illustrated in FIG. 2A, referring to step S100, a first substrate 21 is provided, wherein the first substrate 21 is a semiconductor substrate, and has oxygen precipitates 211 and interstitial oxygen atoms 212. The first substrate 21 may be made of any one of monocrystalline silicon, monocrystalline germanium, silicon germanium, polycrystalline silicon, sapphire, SiC, GaAs, GaN and the like, or a multi-layer composite substrate formed by the above materials. Due to the manufacturing process, the oxygen precipitates 211 in the first substrate are not uniformly distributed. This phenomenon is more apparently exhibited in a monocrystalline silicon substrate. The oxygen precipitates 211 that are not uniformly distributed in the semiconductor substrate may constantly combines the interstitial oxygen atoms 212 and continuously grows, and in addition, new interstitial oxygen atoms 212 may be produced in the semiconductor substrate 21 and aggregate to form new oxygen precipitates 211. Deep studies reveal that these oxygen precipitates may cause non-uniform distribution of an internal stress in the thermal reinforcement process upon the bonding, such that the bonded substrate is subject to severe warpage. As such, subsequent manufacturing of an integrated circuit may be affected, for example, failure of alignment in a photolithography process.

Figure 2B:
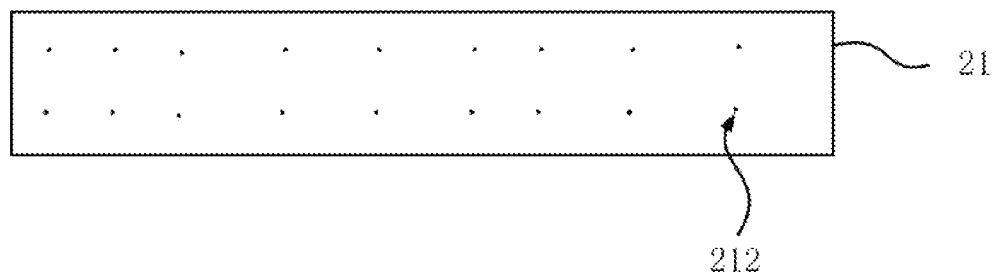
FIG. 2B illustrates a schematic process diagram of a second step in the bonding method for a semiconductor substrate according to one aspect of the present disclosure.

As illustrated in FIG. 2B, referring to step S110, a thermal treatment is performed for the first substrate 21 at the first temperature. The thermal treatment may cause the oxygen precipitates 211 to be partially or totally converted to the interstitial oxygen atoms 212. In addition, the interstitial oxygen atoms 212 are uniformly distributed in the thermal treatment process. In this way, in the subsequent thermal treatment process, the interstitial oxygen atoms are more uniformly nucleated and grow in the entirety of the semiconductor substrate 21, such that the warpage is finally inhibited, and manufacturing yield of the integrated circuits is improved. Two semiconductor substrates are used for bonding, and these two semiconductor substrates are both thermally treated and bonded to each other.

In step S110, for an improved thermal treatment efficiency, the first temperature is preferably in the range of from 850° C. to 1050° C., a time duration of the first temperature is preferably not less than 1.5 h, and more preferably 3 h, and the thermal treatment is preferably performed in an oxygen-containing atmosphere. In the thermal treatment performed in the oxygen-containing atmosphere, an oxidation layer formed on the surface needs to be removed upon the thermal treatment.

Figure 2C:
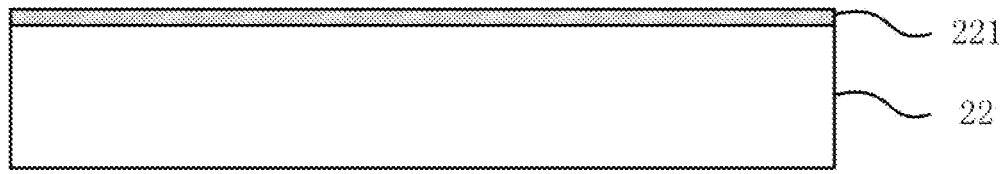
FIG. 2C illustrates a schematic process diagram of a third step in the bonding method for a semiconductor substrate according to one aspect of the present disclosure.

As illustrated in FIG. 2C, referring to step S120, a second substrate 22 is provided. The second substrate 22 may be a glass substrate, a semiconductor substrate or a metal substrate. If the second substrate 22 is a semiconductor substrate, a thermal treatment similar to step S110 is preferably performed to the second substrate 22.

According to the actual needs, in this specific embodiment, an insulating layer 221 is provided on the surface of the substrate 22, wherein the insulating layer 221 is configured to form an SOI substrate that is common in the industry upon the bonding. In another specific embodiment, the insulating layer may also be arranged on the surface of the first substrate 21, or the insulating layer may be arranged on each of the surfaces of the first substrate 21 and the second substrate 22. Alternatively, the first substrate 21 and the second substrate 22 may be directly bonded without the insulating layer. If the insulating layer is formed by an oxidation method, both dry oxygen or wet oxygen shall apply, the oxidation temperature is a temperature value that is higher than the first temperature and lower than the second temperature in the range of from 950° C. to 1150° C., and preferably an oxidation treatment is performed for the semiconductor substrate intended to be used as a device layer. In the oxidation process, a small part of the interstitial oxygen is converted to the oxygen precipitates, the content of the interstitial oxygen is slightly lowered, and a treatment temperature is preferably in the range of from 1000° C. to 1100° C.

Figure 2D:
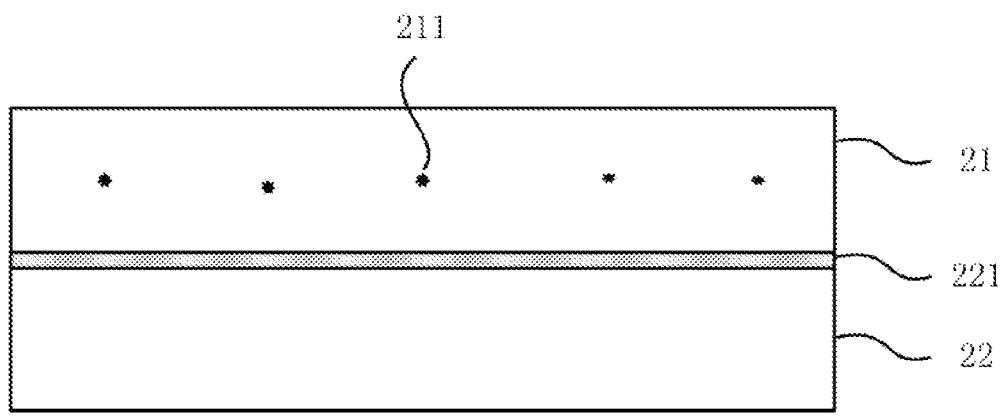
FIG. 2D illustrates a schematic process diagram of a fourth step in the bonding method for a semiconductor substrate according to one aspect of the present disclosure.

As illustrated in FIG. 2D, referring to step S130, the first substrate 21 and the second substrate 22 are bonded, and annealing and reinforcement are performed for a bonded substrate at the second temperature. The second temperature is preferably in the range of from 1050° C. to 1250° C., and a time duration is not less than 2 h. In the annealing and reinforcement process, the interstitial oxygen atoms 212 may be combined to form the oxygen precipitates 211. Since the thermal treatment in step S110 improves the distribution uniformity of the interstitial oxygen atoms 212, the oxygen precipitates 211 formed in this step are more uniformly distributed. This lowers internal stress non-uniformity caused by presence of the oxygen precipitates 211 in the bonded substrate. In the reinforced bonded substrate, the first substrate or the second substrate may be thinned according to the actual needs, to acquire a final product. In the above specific embodiment, the oxidation-treated second substrate 22 having the insulating layer 221 should be thinned and used as the device layer of the final product, and the first substrate 21 subjected to multiple thermal treatments should be used as a support substrate.

Figure 3:
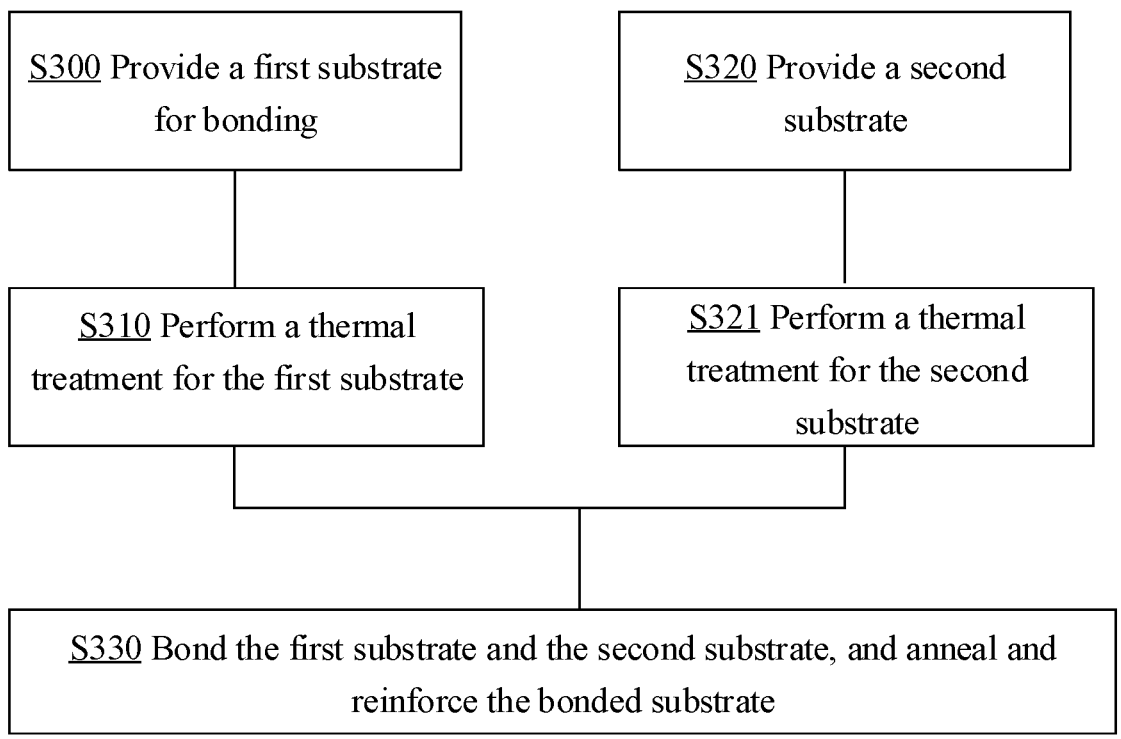
FIG. 3 is a schematic diagram of steps of a bonding method for a semiconductor substrate according to another specific embodiment of the present disclosure.

FIG. 3 is a schematic diagram of steps of a bonding method for a semiconductor substrate according to another specific embodiment of the present disclosure. The method includes: step S300: providing a first substrate for bonding, wherein the first substrate is a semiconductor substrate; step S310, performing a thermal treatment for the first substrate; step S320: providing a second substrate; and step S330: bonding the first substrate and the second substrate, and annealing and reinforcing the bonded substrate at a second temperature.

Optionally, upon the first thermal treatment, an insulating layer is formed on a surface of the semiconductor substrate by an oxidation treatment, wherein a temperature for the oxidation treatment is higher than the first temperature and lower than the second temperature; and two semiconductor substrates for bonding are used, and a semiconductor substrate intended to be used as a device layer is selected for the oxidation treatment and is bonded to the other semiconductor substrate.

Optionally, the first temperature is in the range of 850° C. to 1050° C., and the second temperature is in the range of 1050° C. to 1250° C.

Optionally, in the step of the thermal treatment, a time duration of the first temperature is not less than 1.5 h, and a time duration of the second temperature is not less than 2 h.

Optionally, the thermal treatment is performed in an oxygen-containing atmosphere.

Since the semiconductor substrate for bonding is thermally treated prior to the bonding, the oxygen precipitates in the semiconductor substrate are partially or totally converted to the interstitial oxygen atoms in the thermal treatment process. In the annealing and reinforcement process upon the bonding, the interstitial oxygen atoms may be combined to form the oxygen precipitates. In addition, since the thermal treatment prior to the bonding improves distribution uniformity of the grow-in oxygen precipitates and the interstitial oxygen atoms, the oxygen precipitates formed in the thermal treatment are distributed more uniformly, such that the internal stress caused by the oxygen precipitates in the bonded substrate is reduced.

Different from the above specific embodiment, in this specific embodiment, the second substrate is a semiconductor substrate, and a thermal treatment is performed for the second substrate to improve distribution of the interstitial oxygen atoms therein, such that the oxygen precipitates are more uniformly distributed upon the reinforcement, and flatness of the bonded substrate is enhanced.

Described above are preferred examples of the present disclosure. It should be noted that persons of ordinary skill in the art may derive other improvements or polishments without departing from the principles of the present disclosure. Such improvements and polishments shall be deemed as falling within the protection scope of the present disclosure.

What is claimed is:

1. A bonding method for a semiconductor substrate, comprising:
    performing a thermal treatment for a semiconductor substrate for bonding at a first temperature prior to bonding; and
    thermally reinforcing a bonding interface at a second temperature after the bonding,
    wherein the first temperature is lower than the second temperature, and wherein oxygen precipitates in the semiconductor substrate are partially or totally converted to interstitial oxygen atoms in the thermal treatment; and
    wherein upon the thermal treatment, an insulating layer is formed on a surface of the semiconductor substrate by an oxidation treatment, wherein a temperature for the oxidation treatment is higher than the first temperature and lower than the second temperature.

2. The method according to claim 1, wherein the first temperature is in the range of 850° C. to 1050° C., and the second temperature is in the range of 1050° C. to 1250° C.

3. The method according to claim 1, wherein during the thermal treatment, a time duration of the first temperature is not less than 1.5 hours, and a time duration of the second temperature is not less than 2 hours.

4. The method according to claim 1, wherein the thermal treatment is performed in an oxygen-containing atmosphere.

5. The method according to claim 1, wherein two semiconductor substrates for bonding are used, and a semiconductor substrate intended to be used as a device layer is selected for the oxidation treatment and is bonded to the other semiconductor substrate.

6. A bonded semiconductor substrate, comprising:
a first semiconductor substrate; and
a second semiconductor substrate bonded to the first semiconductor substrate,
wherein a thermal treatment is performed for the first and second semiconductor substrates prior to bonding at a first temperature, wherein the first temperature is not higher than a second temperature at which a bonding interface is thermally reinforced upon the bonding, oxygen precipitates in the first and second semiconductor substrates are partially or totally converted to interstitial oxygen atoms in the thermal treatment, and the interstitial oxygen atoms re-aggregate and grow to new oxygen precipitates in a process of thermal reinforcement at the second temperature; and
wherein upon the thermal treatment, an insulating layer is formed on a surface of the semiconductor substrate by an oxidation treatment, wherein a temperature for the oxidation treatment is higher than the first temperature and lower than the second temperature.

7. The substrate according to claim 6, wherein in the heat treatment, the first temperature is in the range of 850° C. to 1050° C., and the second temperature is in the range of 1050° C. to 1250° C.

8. The substrate according to claim 6, wherein in the step of heat treatment, a time duration of the first temperature is not less than 1.5 h, and a time duration of the second temperature is not less than 2 h.

9. The substrate according to claim 6, wherein the heat treatment is performed in an oxygen-containing atmosphere.

* * * * *